(12) United States Patent
Yi et al.

(10) Patent No.: US 10,432,172 B2
(45) Date of Patent: Oct. 1, 2019

(54) BULK ACOUSTIC FILTER DEVICE AND METHOD OF MANUFACTURING THE SAME

(71) Applicant: Samsung Electro-Mechanics Co., Ltd., Suwon-si (KR)

(72) Inventors: Jin Woo Yi, Suwon-si (KR); Chan Hee Park, Suwon-si (KR); Kwang Su Kim, Suwon-si (KR); Sang Jin Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 140 days.

(21) Appl. No.: 15/673,498

(22) Filed: Aug. 10, 2017

(65) Prior Publication Data

US 2018/0062619 A1  Mar. 1, 2018

(30) Foreign Application Priority Data

Sep. 1, 2016 (KR) .................. 10-2016-0112762
Dec. 5, 2016 (KR) .................. 10-2016-0164443

(51) Int. Cl.
*H03H 9/54* (2006.01)
*H03H 9/17* (2006.01)
(Continued)

(52) U.S. Cl.
CPC .............. *H03H 9/54* (2013.01); *H03H 3/02* (2013.01); *H03H 9/02007* (2013.01);
(Continued)

(58) Field of Classification Search
CPC .. H03H 9/02007; H03H 9/1014; H03H 9/105; H03H 9/133; H03H 9/173;
(Continued)

(56) References Cited

U.S. PATENT DOCUMENTS 6,349,454 B1 * 2/2002 Manfra ............... H03H 3/02
                                                     29/25.35
7,863,699 B2 * 1/2011 Dropmann ............ H01L 23/66
                                                       257/254

(Continued)

FOREIGN PATENT DOCUMENTS

KR 10-2012-0139265 A 12/2012
KR 10-2013-0092824 A 8/2013
(Continued)

*Primary Examiner* — Barbara Summons
(74) *Attorney, Agent, or Firm* — NSIP Law (57) ABSTRACT

A bulk acoustic filter device includes: a substrate including a through hole formed by a first recess and a second recess adjacent to the first recess; a membrane layer forming a cavity with the substrate; a filter including a lower electrode disposed on the membrane layer, a piezoelectric layer disposed to cover a portion of the lower electrode, and an upper electrode formed to cover a portion of the piezoelectric layer; and an electrode connecting member disposed in the substrate, and connected to either one of the lower electrode and the upper electrode, wherein the electrode connecting member includes an insertion electrode disposed in the first recess, and a via electrode connected to the insertion electrode, and disposed on an inner peripheral surface of the second recess and a surface of the substrate.

19 Claims, 7 Drawing Sheets

(51) Int. Cl.
*H03H 9/10* (2006.01)
*H03H 3/02* (2006.01)
*H03H 9/02* (2006.01)
*H03H 9/13* (2006.01)

(52) U.S. Cl.
CPC .......... *H03H 9/105* (2013.01); *H03H 9/1014* (2013.01); *H03H 9/133* (2013.01); *H03H 9/173* (2013.01); *H03H 9/174* (2013.01); *H03H 2003/021* (2013.01); *H03H 2003/023* (2013.01)

(58) Field of Classification Search
CPC .......... H03H 9/174; H03H 9/54; H03H 9/587; H03H 9/588; H03H 9/02047; H03H 9/02055; H03H 3/02; H03H 2003/021; H03H 2003/023
USPC ........................................ 333/133, 187, 189
See application file for complete search history.

(56) References Cited

U.S. PATENT DOCUMENTS

| | | | | |
|---|---|---|---|---|
| 9,787,280 | B2* | 10/2017 | Son | H03H 3/04 |
| 9,929,716 | B2* | 3/2018 | Lee | H03H 3/02 |
| 2013/0207241 | A1 | 8/2013 | Lee et al. | |
| 2014/0084473 | A1 | 3/2014 | Moon et al. | |
| 2016/0079956 | A1* | 3/2016 | Son | H03H 3/04 |
| | | | | 333/187 |
| 2016/0204761 | A1* | 7/2016 | Lee | H03H 3/02 |
| | | | | 333/187 |
| 2017/0244379 | A1* | 8/2017 | Yang | H03H 9/17 |

FOREIGN PATENT DOCUMENTS

KR  10-2014-0039895 A    4/2014
WO  WO 2004/114397 A1 * 12/2004

* cited by examiner

BULK ACOUSTIC FILTER DEVICE AND METHOD OF MANUFACTURING THE SAME

CROSS-REFERENCE TO RELATED APPLICATIONS

This application claims the benefit under 35 USC 119(a) of Korean Patent Application Nos. 10-2016-0112762 and 10-2016-0164443 filed on Sep. 1, 2016 and Dec. 5, 2016, respectively, in the Korean Intellectual Property Office, the entire disclosures of which are incorporated herein by reference for all purposes.

BACKGROUND

1. Field

The following description relates to a bulk acoustic filter device and a method of manufacturing a bulk acoustic filter device.

2. Description of Related Art

A resonator is a device in which energy resonates at a specific frequency, and is mainly used for filters, oscillators, and frequency counters, for example. Although there are various structures for resonance using a resonator, a resonant structure using acoustic waves has recently been popular.

Unlike resonators using surface acoustic waves, which are widely used in the market, in order to use acoustic waves in the thickness direction, a bulk acoustic wave resonator, in which electrodes with high acoustic impedance are disposed on opposite sides with a piezoelectric material disposed therebetween, has recently become more popular in the market of filters in high frequency applications.

In recent years, a thickness of a wafer used as a substrate in a bulk acoustic wave resonator has been increased to improve rigidity. However, as a thickness of the wafer is increased, a defect may occur when a connecting member, such as a through silicon via (TSV), for connection of electrodes is formed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic filter device includes: a substrate including a through hole formed by a first recess and a second recess adjacent to the first recess; a membrane layer forming a cavity with the substrate; a filter including a lower electrode disposed on the membrane layer, a piezoelectric layer disposed to cover a portion of the lower electrode, and an upper electrode formed to cover a portion of the piezoelectric layer; and an electrode connecting member disposed in the substrate, and connected to either one of the lower electrode and the upper electrode, wherein the electrode connecting member includes an insertion electrode disposed in the first recess, and a via electrode connected to the insertion electrode, and disposed on an inner peripheral surface of the second recess and a surface of the substrate.

A diameter of the first recess may be smaller than a diameter of the second recess.

The insertion electrode may be disposed in the first recess and may have a cylindrical shape.

The via electrode may be formed by electrolytic plating.

The bulk acoustic filter device may further include a solder ball disposed on the via electrode and configured to be connected to a main substrate.

The substrate may include a seed layer disposed on an inner peripheral surface of the through hole.

The upper electrode may include a frame portion.

The filter may further include a metal pad disposed on the upper electrode and the lower electrode.

The filter may further include a passivation layer formed in a region of the upper electrode on which a region of the metal pad is not disposed.

The through hole may have a stepped diameter configuration.

In another general aspect, a method to manufacture a bulk acoustic filter device includes: forming a first recess in a substrate; forming an insertion electrode in the first recess; forming a filter on the substrate; forming a second recess in the substrate; and forming a via electrode in the second recess, wherein the via electrode is connected to the insertion electrode.

The via electrode may be formed on an inner peripheral surface of the second recess and a surface of the substrate.

The via electrode may be formed through electrolytic plating.

The insertion electrode may be connected to either one of the lower electrode and the upper electrode.

A diameter of the first recess may be smaller than a diameter of the second recess.

The method may further include disposing a solder ball on the via electrode.

The method may further include: bonding a cap member to the substrate, after the forming of the filter.

The first recess and the second recess are disposed adjacent to each other to form a through hole.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
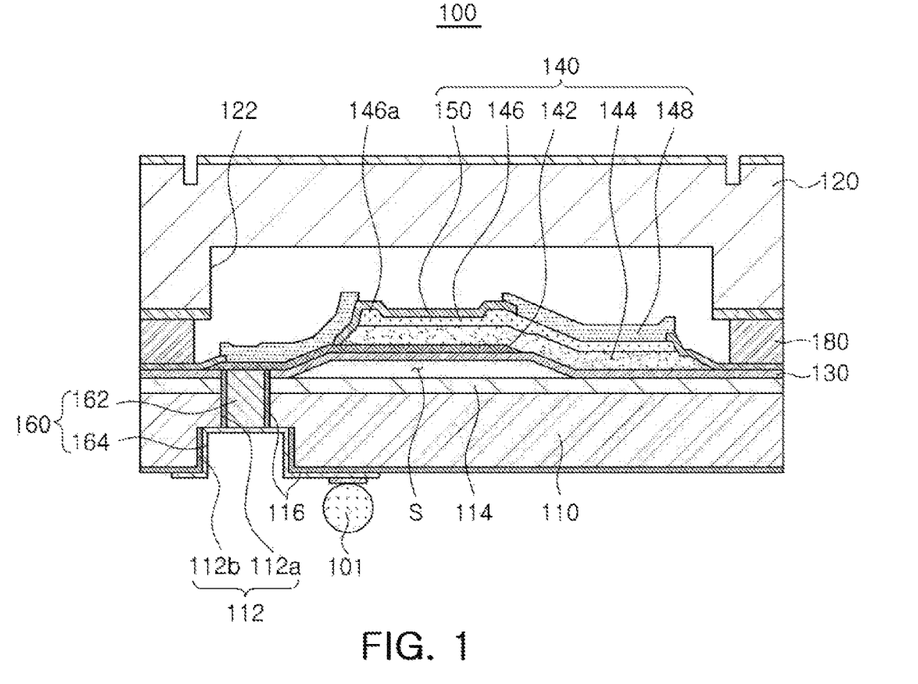
FIG. 1 is a schematic cross-sectional view illustrating a bulk acoustic filter device, according to an embodiment.

FIG. 1 is a schematic cross-sectional view illustrating a bulk acoustic filter device 100, according to an embodiment.

Referring to FIG. 1, the bulk acoustic filter device 100 includes, for example, a substrate 110, a cap 120, a membrane layer 130, a filter 140, and an electrode connecting member 160.

The substrate 110 is a substrate on which silicon is laminated. For example, a silicon wafer is used as the substrate 110. In addition, a through hole 112 is formed in the substrate 110 in a stepped diameter configuration. The through hole 112 includes a first recess 112a and a second recess 112b connected to the first recess 112a. For example, the first recess 112a has a smaller diameter than a diameter of the second recess 112b. The first recess 112a is configured to accommodate an insertion electrode 162 of the electrode connecting member 160, and the second recess 112b is configured to accommodate a via electrode 164 of the electrode connecting member 160.

A substrate protection layer 114 is formed on an upper surface of the substrate 110. The substrate protection layer 114 prevents the substrate 110 from being etched when a sacrificial layer 190, to be described later, is removed.

A seed layer 116 is formed on an inner peripheral surface of the through hole 112 of the substrate 110. The seed layer 116 is formed of an aluminum nitride (AlN) material, for example.

The cap 120 is bonded to and installed in an upper portion of the substrate 110 bonding units 180, and seals a portion of the substrate 110 in which the filter 140 is disposed. Bonding units 180 are provided in the substrate 110 and the cap 120, for example, and may be formed of the same materials or different materials. For example, the bonding units 180 are formed of either one of gold (Au) and tin (Sn), or alloys of either one of gold (Au) and tin (Sn).

The cap 120 includes a recess 122 configured to form an internal space together with the substrate 110.

The membrane layer 130 forms a cavity S together with the substrate 110. The cavity S is formed, for example, by removing the sacrificial layer 190 to be described later. The membrane layer 130 prevents a lower electrode 142 from being etched when the sacrificial layer 190 is removed.

The filter 140 is formed on the substrate 110, and filter includes the lower electrode 142, a piezoelectric layer 144, and an upper electrode 146.

The lower electrode 142 is formed on the membrane layer 130, and a portion of the lower electrode 142 is formed on the cavity S. In addition, the lower electrode 142 is connected to the electrode connecting member 160.

For example, the lower electrode 142 is formed using a conductive material such as molybdenum (Mo), ruthenium (Ru), tungsten (W), iridium (Ir), or platinum (Pt), or an alloy of molybdenum (Mo), ruthenium (Ru), tungsten (W), iridium (Ir), or platinum (Pt).

The lower electrode 142 may be used as either one of an input electrode and an output electrode to apply electrical signals such as radio frequency (RF) signals. For example, when the lower electrode 142 is the input electrode, the upper electrode 146 is the output electrode. Alternatively, when the lower electrode 142 is the output electrode, the upper electrode 146 is the input electrode.

The piezoelectric layer 144 covers at least a portion of the lower electrode 142. In addition, the piezoelectric layer 144 converts electrical signals input from the lower electrode 142 or the upper electrode 146 into acoustic waves.

For example, when an electric field varying over time is induced into the upper electrode 146, the piezoelectric layer 144 converts the electrical signals input to the upper electrode 146 into physical vibrations. In addition, the piezoelectric layer 144 converts the physical vibrations into acoustic waves.

The piezoelectric layer 144 may be formed by depositing aluminum nitride, zinc oxide, or lead zirconate titanate on an upper portion of the lower electrode 142.

The upper electrode 146 covers at least a portion of the piezoelectric layer 144. For example, the upper electrode 146 is formed using a conductive material such as molybdenum (Mo), ruthenium (Ru), tungsten (W), iridium (Ir), or platinum (Pt), or an alloy of molybdenum (Mo), ruthenium (Ru), tungsten (W), iridium (Ir), or platinum (Pt), that is similar to the material of the lower electrode 142.

The upper electrode 146 may be used as either one of an input electrode and an output electrode to apply electrical signals such as radio frequency (RF) signals.

The upper electrode 146 includes a frame portion 146a. For example, the frame portion 146a is disposed in a region outside of a central portion of the piezoelectric layer 144 and is not disposed in the central portion of the piezoelectric layer 144. The frame portion 146a reflects lateral waves generated during resonance into an active area of the filter 140 so as to confine resonance energy to the active area.

In addition, the filter 140 includes a metal pad 148 that is electrically connected to each of the lower electrode 142 and the upper electrode 146.

Further, the filter 140 includes a passivation layer 150 formed on a region of the upper electrode on which metal pad which 148 is not disposed. The passivation layer 150 covers a portion of the upper electrode 146 that is not covered by the metal pad 148, thereby preventing the upper electrode 146 from being damaged during processing. Further, a thickness of the passivation layer 150 may be adjusted by etching to control a resonant frequency in a final process. In other words, the thickness of the passivation layer 150 may be reduced in the final process.

The electrode connecting member 160 is formed in the substrate 110, and may be connected to the lower electrode 142 or the upper electrode 146. For example, two electrode connecting members 160 are formed in the substrate 110, and the two electrode connecting members 160 are connected to the lower electrode 142 and the upper electrode 146, respectively.

The electrode connecting member 160 includes an insertion electrode 162 inserted into and disposed in the first recess 112a, and exposed through one surface of the substrate 110, and a via electrode 164 connected to the insertion electrode 162, and formed on an inner peripheral surface of the second recess 112b and another surface of the substrate 110 that is opposite the one surface of the substrate 110.

For example, the insertion electrode 162 is filled in the first recess 112a such that the insertion electrode 162 is exposed through one surface of the substrate 110, and has a cylindrical shape. In addition, the insertion electrode 162 may be formed of a copper (Cu) or titanium (Ti) material, or a material containing Cu or Ti.

The via electrode 164 is formed in an inner peripheral surface of the second recess 112b of the substrate 110 and another surface of the substrate 110 that is opposite the one surface of the substrate 110, in the form of a thin film. The via electrode 164 may be formed of a Cu or Ti material, or a material containing Cu or Ti, similar to the material of the insertion electrode 162. Additionally, the via electrode 164 may be formed by electrolytic plating.

Further, a solder ball 101 for a connection with a main substrate (not shown) is formed in the via electrode 164.

As described above, because the electrode connecting member 160 is formed of the insertion electrode 162 and the via electrode 164, even when a thickness of the substrate 110 is increased, a failure of a connection between the electrode connecting member 160 and the lower electrode 142 as well as a failure of a connection between the electrode connecting member 160 and the upper electrode 146 may be prevented.

In other words, if a thickness of the substrate 110 is increased, and an electrode connecting member includes only the via electrode 164 formed by electrolytic plating, the electrode connecting member may be not formed in a lower portion of the through hole 112.

However, in the disclosed embodiment, the electrode connecting member 160 is formed of the insertion electrode 162 and the via electrode 164, and, thus, a defect in which the electrode connecting member 160 is not formed in a lower portion of the through hole 112 may be prevented from occurring.

Further, formation limitations of the seed layer 116 formed in the substrate 110 may be reduced. In other words, when a thickness of the substrate 110 is increased, a depth of the through hole 112 is greater. Moreover, if the seed layer 116 were formed in a single process, the seed layer 116 may not be formed on one side of the through hole 112. However, the through hole 112 is formed of the first recess 112a and the second recess 112b, and the seed layer is formed in a separate process, so the seed layer 116 may be easily formed.

Moreover, as a diameter of the insertion electrode 162 of the electrode connecting member 160 is adjusted, arrangement of the filter 140 may be freely changed.

In addition, when an external shock is applied through the insertion electrode 162, damage to the filter 140 may be prevented. In other words, due to the insertion electrode 162, a shock applied to the filter 140 is migrated through the insertion electrode 162, so damage to the filter 140 may be prevented.

Further, as the electrode connecting member 160 is formed of the insertion electrode 162 and the via electrode 164, damage to the substrate 110 caused by thermal deformation may be prevented.

FIG. 1, illustrates, by way of example only, a case in which the electrode connecting member 160 is connected to only the lower electrode 142. However, the disclosure is not limited to this example. The electrode connecting member 160 may be provided as a plurality of electrode connecting members, and at least one of the electrode connecting members 160 may be connected to the upper electrode 146.

FIGS. 2 through 8 are process diagrams illustrating a method of manufacturing the bulk acoustic filter device 100, according to an embodiment.

Figure 2:
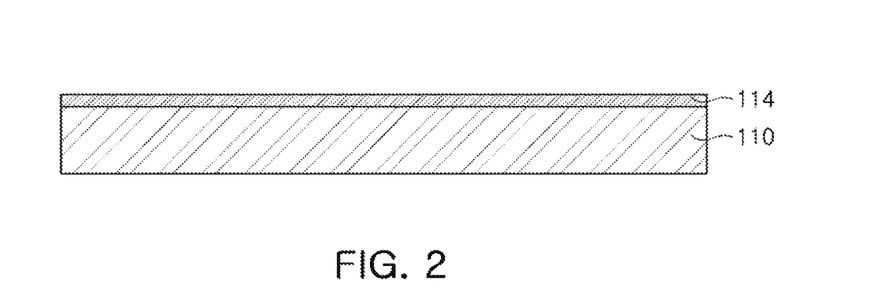
FIGS. 2 through 8 are process diagrams illustrating a method of manufacturing the bulk acoustic filter device of FIG. 1, according to an embodiment.

As illustrated in FIG. 2, the substrate 110 is prepared and the substrate protection layer 114 is formed on the substrate 110.

Figure 3:
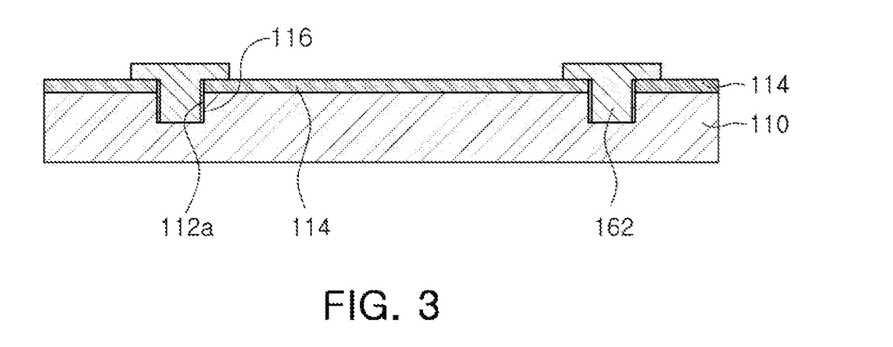

Thereafter, as illustrated in FIG. 3, the first recess 112a is formed in the substrate 110, and the insertion electrode 162 is formed in the first recess 112a. For example, the insertion electrode 162 is formed of Cu or Ti, or a material containing Cu or Ti. For example, the seed layer 116 is formed on the inner peripheral surface of the first recess 112a, and the Cu or Ti, or the material containing Cu or Ti, is filled in the first recess 112a to form the insertion electrode 162. In addition, when the insertion electrode 162 is formed, an end of the insertion electrode 162 may be formed to protrude from the substrate 110.

Figure 4:
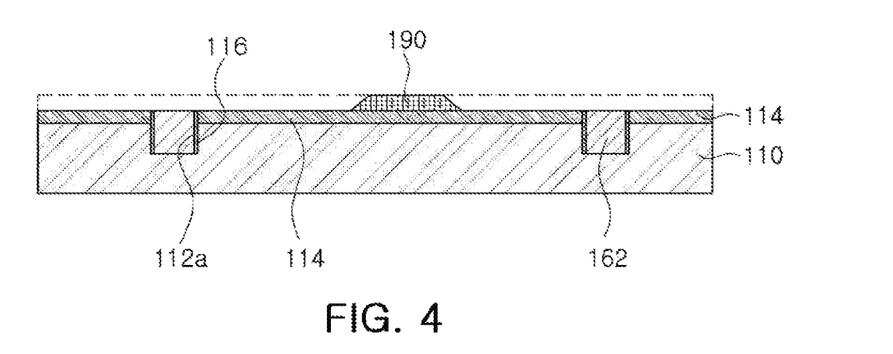

As illustrated in FIG. 4, the insertion electrode 162 may ultimately have a cylindrical shape as a result of a chemical mechanical polishing (CMP) process, and is exposed through one surface of the substrate 110. However, the insertion electrode 162 is not limited to having a cylindrical shape, and a shape of the insertion electrode 162 may be changed in various ways.

In addition, when formation of the insertion electrode 162 in the CMP process is completed, the sacrificial layer 190 is formed on the substrate protection layer 114.

Figure 5:
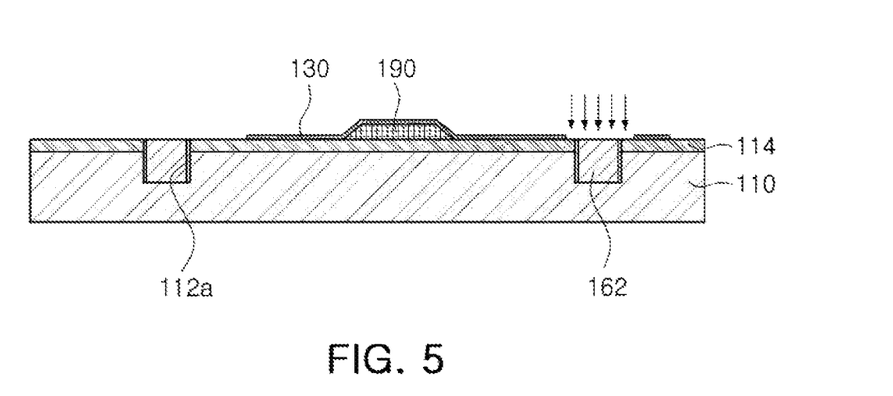

Thereafter, as illustrated in FIG. 5, the membrane layer 130 is formed to cover the sacrificial layer 190, and an etching process is then performed to remove a portion of the membrane layer 130 and thereby externally expose the insertion electrode 162. For example, the etching process may be a dry etching process.

Figure 6:
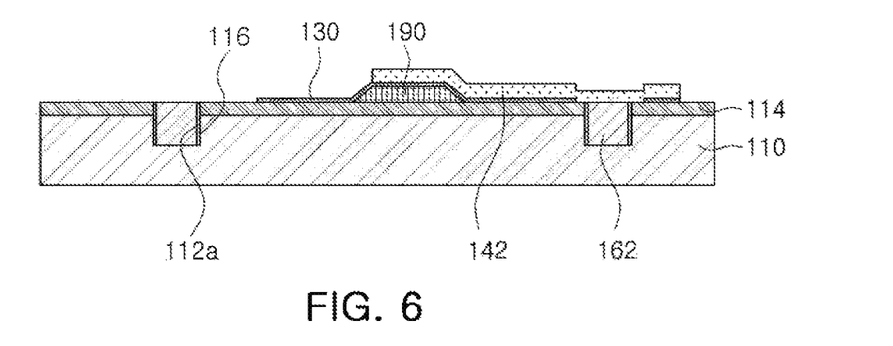

Thereafter, as illustrated in FIG. 6, the lower electrode 142 is formed to cover the insertion electrode 162 and the sacrificial layer 190.

Figure 7:
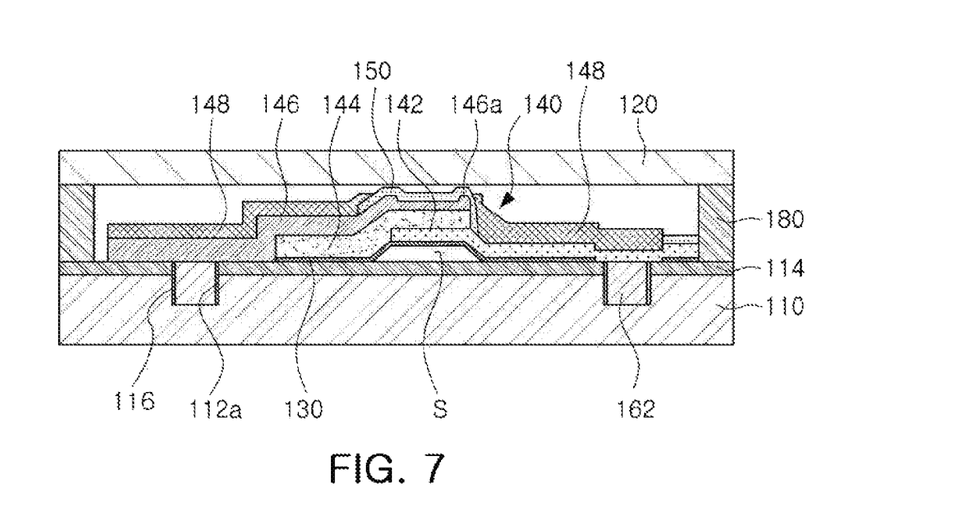

Thereafter, as illustrated in FIG. 7, the filter 140 is formed. When formation of the filter 140 is completed, the cap 120 is combined with the substrate 110. For example, the cap 120 is attached to the substrate 110 by the bonding units 180.

Figure 8:
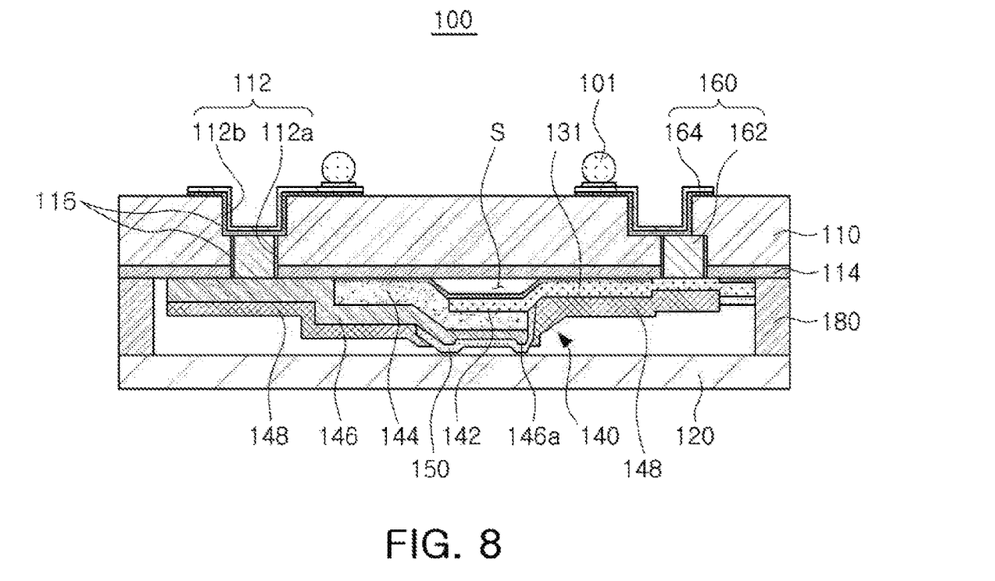

Thereafter, as illustrated in FIG. 8, the second recess 112b is formed in the substrate 110. The via electrode 164 is then formed on an inner peripheral surface of the second recess 112b and on another surface of the substrate 110 opposite the one surface of the substrate 110, such that the via electrode 164 is connected to the insertion electrode 162.

For example, the via electrode 164 is formed in the form of a thin film. Moreover, the via electrode 164 may be formed of a Cu or Ti material, or a material containing Cu or Ti, that similar to the manner in which the insertion electrode 162 is formed. For example, the seed layer 116 is formed on the inner peripheral surface of the second recess 112b, and the Cu or Ti, or the material containing Cu or Ti, is formed in the second recess 112b to form the via electrode 164.

The via electrode 164 may be formed by electrolytic plating.

Thereafter, the solder ball 101 for a connection with a main substrate (not shown) is formed on the via electrode 164.

As described above, even when a thickness of the substrate 110 is increased, a connection failure of the electrode connecting member 160 and the lower electrode 142 and a connection failure of the electrode connecting member 160 and the upper electrode 146 may be prevented, because the insertion electrode 162 is formed, and the via electrode 164 is thereafter formed and connected to the insertion electrode 162 in a subsequent process.

In other words, if a thickness of the substrate 110 is increased, and an electrode connecting member formed of only the via electrode 164 simply by electrolytic plating is provided, the electrode connecting member 160 may not be formed in a lower portion of the through hole 112, thereby resulting in a connection failure.

However, because the electrode connecting member 160 is formed of the insertion electrode 162 and the via electrode 164, a defect in which the electrode connecting member 160 is not formed in a lower portion of the through hole 112 may be prevented from occurring.

Further, the disclosed embodiment addresses formation limitations of the seed layer 116 formed in the substrate 110. In other words, when a thickness of the substrate 110 is increased, a depth of the through hole 112 becomes deeper. Moreover, when if a seed layer were formed in the through hole 112 a single process, the seed layer may not be formed on one side of the through hole 112. However, in the disclosed embodiment, the seed layer 116 may be easily formed on both sides of the through hole 112 because the through hole 112 is formed of the first recess 112a and the second recess 112b, and the seed layer 116 is formed in a process that is separate from the process of forming the through hole 112 and therefore the seed layer 116 may be easily formed.

Moreover, as a diameter of the insertion electrode 162 is adjusted, an arrangement of the filter 140 may be freely changed.

In addition, when an external shock is applied through the insertion electrode 162, damage to the filter 140 may be prevented. In other words, due to the insertion electrode 162, a shock applied to the filter 140 is migrated through the insertion electrode 162, so damage to the filter 140 may be prevented.

Further, since the electrode connecting member 160 is formed of the insertion electrode 162 and the via electrode 164, damage to the substrate 110 due to thermal deformation may be prevented.

Figure 9:
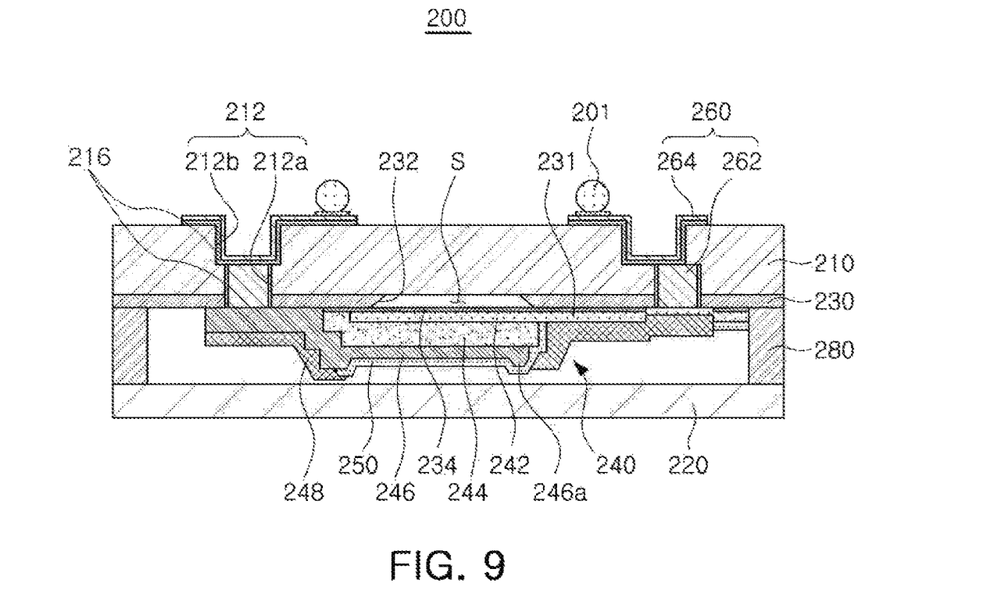
FIG. 9 is a schematic cross-sectional view illustrating a bulk acoustic filter device, according to another embodiment.

FIG. 9 is a schematic cross-sectional view illustrating a bulk acoustic filter device 200, according to another embodiment.

Referring to FIG. 9, the bulk acoustic filter device 200 includes, for example, a substrate 210, a cap 220, a membrane layer 230, a filter 240, and an electrode connecting member 260.

The substrate 210 is, for example, a substrate on which silicon is laminated. For example, a silicon wafer is used as the substrate 210. In addition, a through hole 212 is formed in the substrate 110 in a stepped diameter configuration. The through hole 212 includes a first recess 212a and a second recess 212b connected to the first recess 212a. For example, the first recess 212a has a diameter that is smaller than a diameter of the second recess member 212b.

A seed layer 216 is formed on an inner peripheral surface of the through hole 212 of the substrate 210. The seed layer 216 is formed of an aluminum nitride (AlN) material, for example.

The cap 220 is bonded to and installed on an upper portion of the substrate 210 through bonding units 280, and seals a portion in which the filter 240 is disposed. The bonding units 280 are provided in the substrate 210 and the cap 220, and may be formed of the same materials or different materials. For example, the bonding units 280 are formed of either one of gold (Au) and tin (Sn), or an alloy of either one of gold (Au) and tin (Sn).

The membrane layer 230 forms a cavity S together with the substrate 210. The cavity S is formed by removing a sacrificial layer 290 to be described later. To this end, a cavity-forming recess 232 is formed in the membrane layer 230 to form the cavity S when the sacrificial layer 290 is removed. An etch stop layer 234 is disposed on the membrane layer 230, and covers the cavity S. In other words, the etch stop layer 234 prevents a lower electrode 242 from being damaged when the sacrificial layer 290 is removed.

The filter 240 is formed on the substrate 210, and filter includes the lower electrode 242, a piezoelectric layer 244, and an upper electrode 246.

The lower electrode 242 is formed on the membrane layer 230, and a portion of the lower electrode 242 is formed on the cavity S. In addition, the lower electrode 242 is connected to the electrode connecting member 260.

For example, the lower electrode 242 is formed using a conductive material such as Mo, Ru, W, Ir, or Pt, or an alloy of Mo, Ru, W, Ir, or P.

The lower electrode 242 may be used as one of an input electrode and an output electrode to apply electrical signals such as RF signals. For example, when the lower electrode 242 is the input electrode, the upper electrode 246 is the output electrode. Alternatively, when the lower electrode 242 is the output electrode, the upper electrode 246 is the input electrode.

The piezoelectric layer 244 covers at least a portion of the lower electrode 242. In addition, the piezoelectric layer 244 converts electrical signals input from the lower electrode 242 or the upper electrode 246 into acoustic waves.

For example, when an electric field varying over time is induced into the upper electrode 246, the piezoelectric layer 244 converts the electrical signals input to the upper electrode 246 into physical vibrations. In addition, the piezoelectric layer 244 converts the physical vibrations having been converted into acoustic waves.

The piezoelectric layer 244 may be formed by depositing aluminum nitride, zinc oxide, or lead zirconate titanate on an upper portion of the lower electrode 242.

The upper electrode 246 is covers at least a portion of the piezoelectric layer 244. For example, the upper electrode 246 is formed of a conductive material such as Mo, Ru, W, Ir, or Pt, or an alloy of Mo, Ru, W, Ir, or Pt, that is similar to the material of the lower electrode 242.

The upper electrode 246 may be used as one of an input electrode and an output electrode to apply electrical signals such as RF signals.

The upper electrode 246 includes a frame portion 246a. For example, the frame portion 246a is disposed in a region outside of a central portion of the piezoelectric layer 244 and is not disposed in the central portion of the piezoelectric layer 244. In addition, the frame portion 246a reflects lateral waves generated during resonance into an active area of the filter 240 so as to confine resonance energy in the active area.

In addition, the filter 240 includes a metal pad 248 that is electrically connected to each of the lower electrode 242 and the upper electrode 246.

Further, the filter 240 includes a passivation layer 250 formed on a region of the upper electrode on which the metal pad 248 is not disposed. The passivation layer 250 covers the upper electrode 246, thereby preventing the upper electrode 246 from being damaged during processing. Further, a thickness of the passivation layer 250 may be adjusted by etching to control a resonant frequency in a final process. In other words, the thickness of the passivation layer 250 may be reduced in the final process.

The electrode connecting member 260 is formed in the substrate 210, and is connected to the lower electrode 242 or the upper electrode 246. For example, two electrode connecting members 260 are formed in the substrate 210, and the two electrode connecting members 260 are connected to the lower electrode 242 and the upper electrode 246, respectively.

The electrode connecting member 260 includes an insertion electrode 262 inserted into and disposed in the first recess 212a, and exposed through one surface of the substrate 210, and a via electrode 264 connected to the insertion electrode 262 and formed on an inner peripheral surface of the second recess 212b and another surface of the substrate 210 opposite the one surface of the substrate 210.

For example, the insertion electrode 262 is filled in the first recess 212a so as to be exposed through one surface of the substrate 210, and has a cylindrical shape. In addition, the insertion electrode 262 may be formed of a Cu or Ti material or a material containing Cu or Ti.

The via electrode 264 may be formed on an inner peripheral surface of the second recess and the other surface surface of the substrate 210 opposite the one surface of the substrate 210. Additionally, the via electrode 264 may be formed of a Cu or Ti material or a material containing Cu or Ti, similar to the material of the insertion electrode 262.

The via electrode 264 may be formed by electrolytic plating.

Further, a solder ball 201 for a connection with a main substrate (not shown) is formed in the via electrode 264.

As described above, because the electrode connecting member 260 is formed of the insertion electrode 262 and the via electrode 264, even when a thickness of the substrate 210 is increased, failure of a connection between the electrode connecting member 260 and the lower electrode 242, and failure of a connection between the electrode connecting member 260 and the upper electrode 246 may be prevented.

In other words, if a thickness of the substrate 210 is increased, and an electrode connecting member includes only the via electrode 264 formed by electrolytic plating, the electrode connecting member 260 may be not formed in a lower portion of the through hole 212.

However, in the disclosed embodiment, the electrode connecting member 260 is formed of the insertion electrode 262 and the via electrode 264, and, thus, a defect in which the electrode connecting member 260 is not formed in a lower portion of the through hole 212 may be prevented from occurring.

Further, formation limitations of the seed layer 216 formed in the substrate 210 may be reduced. In other words, when a thickness of the substrate 210 is increased, a depth of the through hole 212 becomes deeper. Moreover, when the seed layer 216 is formed in a single process, the seed layer 216 may not be formed on one side of the through hole 212. However, in the disclosed embodiment, the through hole 212 is formed of the first recess 212a and the second recess 212b, and the seed layer is formed in a process that is separate from the process of forming the through hole 212, and therefore the seed layer 216 may be easily formed.

As a diameter of the insertion electrode 262 is adjusted, an arrangement of the filter 240 may be freely changed.

In addition, when an external shock is applied through the insertion electrode 262, damage to the filter 240 may be prevented. In other words, due to the insertion electrode 262, a shock applied to the filter 240 is migrated thorough the insertion electrode 262, so damage to the filter 240 may be prevented.

Further, because the electrode connecting member 260 is formed of the insertion electrode 262 and the via electrode 264, damage to the substrate 210 due to thermal deformation, may be prevented.

FIGS. 10 through 16 are process diagrams illustrating a method of manufacturing the bulk acoustic filter device 200, according to an embodiment.

Figure 10:
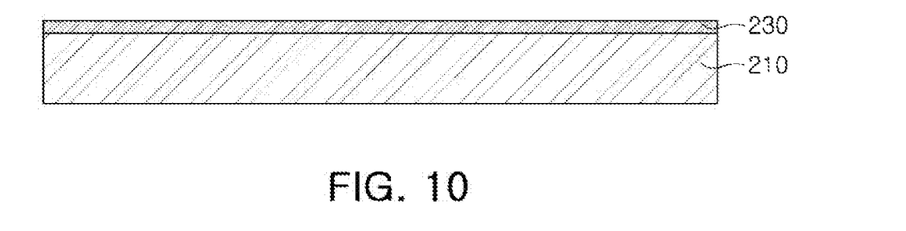
FIGS. 10 through 16 are process diagrams illustrating a method of manufacturing the bulk acoustic filter device of FIG. 9, according to an embodiment.

As illustrated in FIG. 10, the membrane layer 230 is formed on the substrate 210.

Figure 11:
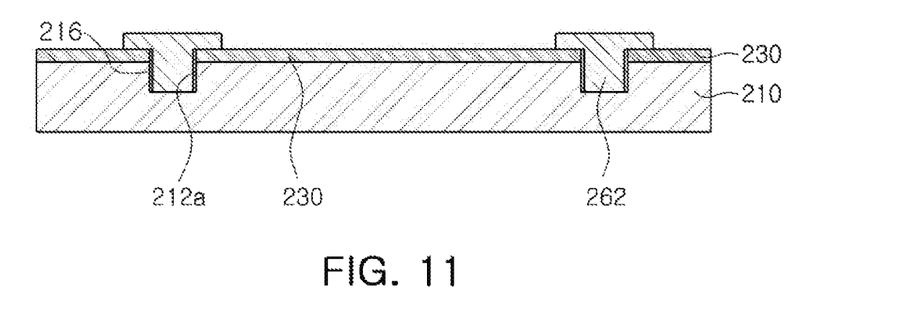

Thereafter, as illustrated in FIG. 11, the first recess 212a is formed in the substrate 210, and the insertion electrode 262 is formed in the first recess 212a. The insertion electrode 262 may be formed of a Cu or Ti material, or a material containing Cu or Ti. For example, the seed layer 216 is formed on the inner peripheral surface of the first recess 212a, and the Cu or Ti, or the material containing Cu or Ti, is filled in the first recess 212a. When the insertion electrode 262 is formed, an end of the insertion electrode 262 may be formed to protrude from the substrate 210.

Figure 12:
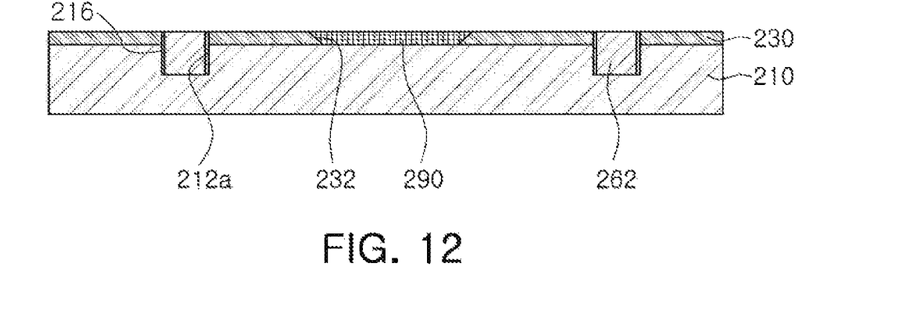

As illustrated in FIG. 12, the insertion electrode 262 may ultimately have a cylindrical shape as a result of a CMP process. In addition, after the CMP process, the cavity-forming recess 232 is formed in the membrane layer 230, and the sacrificial layer 290 is inserted into the cavity-forming recess 232.

Figure 13:
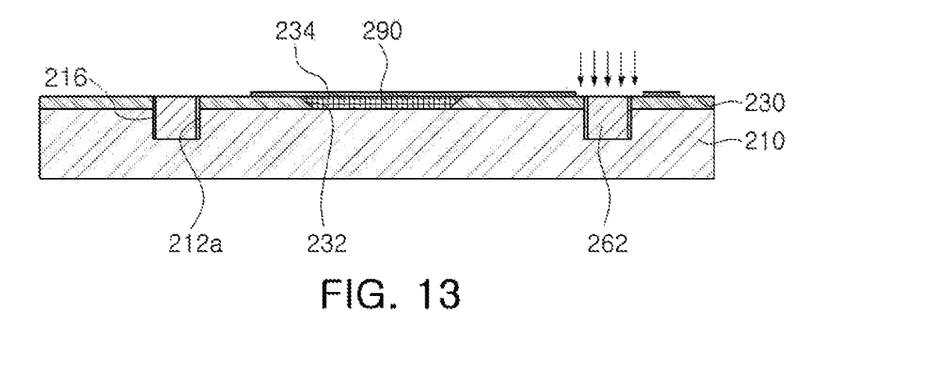

Thereafter, as illustrated in FIG. 13, the etch stop layer 234 is formed to cover the sacrificial layer 290, and an etching process is then performed to externally expose the insertion electrode 262. For example, the etching process is a dry etching process.

Figure 14:
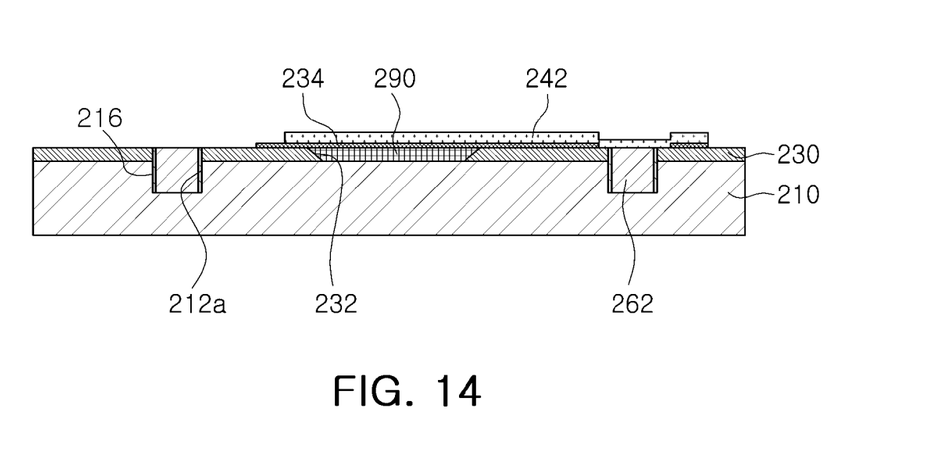

Thereafter, as illustrated in FIG. 14, the lower electrode 242 is formed on the membrane layer 230 and over the cavity S and the insertion electrode 262.

Figure 15:
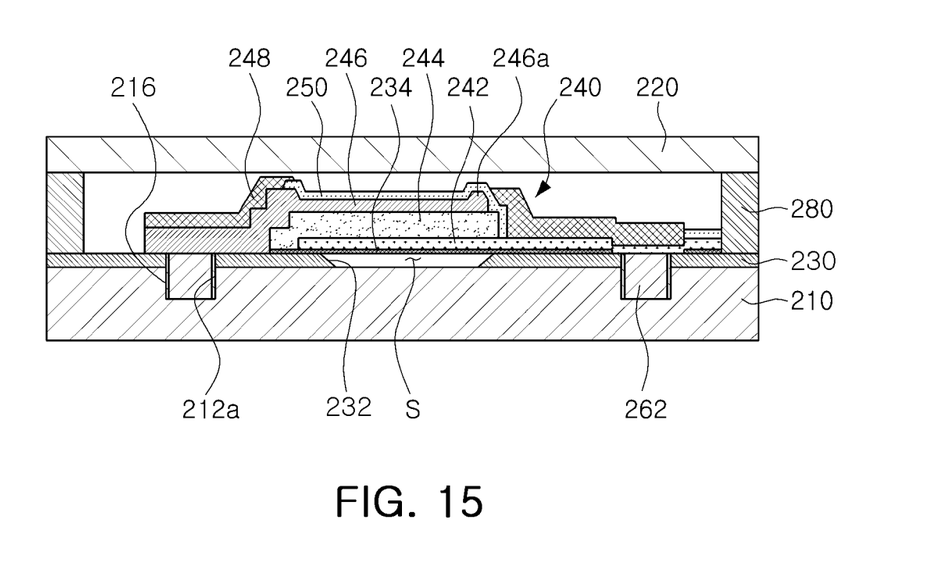

Thereafter, as illustrated in FIG. 15 the filter 240, that is, the piezoelectric layer 244, the upper electrode 246, the metal pad 248, and the passivation layer 250, is formed on the substrate 210, and the cap 220 is combined with the substrate 210. The filter 240 may have a flat shape. In other words, the cavity S may be formed in the membrane layer 230.

Figure 16:
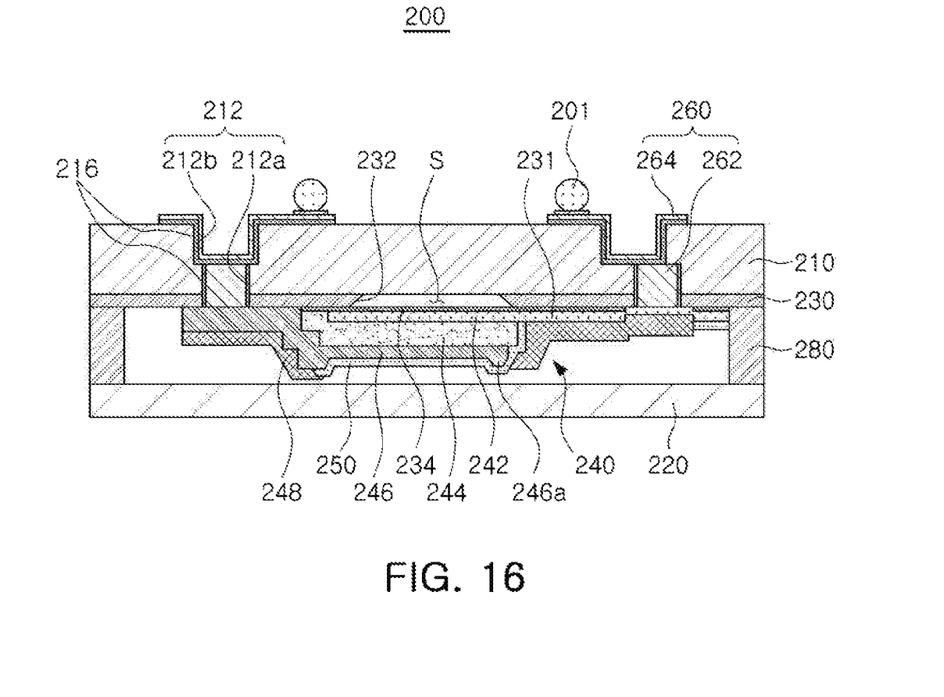

Thereafter, as illustrated in FIG. 16, the second recess 212b is formed in the substrate 210, and the via electrode 264 is thereafter formed and connected to the insertion electrode 262. In addition, the via electrode 264 is formed of a Cu or Ti material or a material containing Cu or Ti in a manner similar to the manner in which the insertion electrode 262 is formed. Moreover, the via electrode 264 may be formed by electrolytic plating. For example, the seed layer 216 is formed on the inner peripheral surface of the second recess 212b, and the Cu or Ti, or the material containing Cu or Ti, is formed in the second recess 212b to form the via electrode 264.

Further, the solder ball 201 is formed on the via electrode 264, which is extended to a bottom surface of the substrate 210.

As set forth above, according to embodiments, the occurrence of defects may be reduced.

Additionally, damage to a substrate due to thermal deformation may be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic filter device, comprising:
   a substrate comprising a through hole formed by a first recess and a second recess adjacent to the first recess;
   a membrane layer forming a cavity with the substrate;
   a filter comprising a lower electrode disposed on the membrane layer, a piezoelectric layer disposed to cover a portion of the lower electrode, and an upper electrode formed to cover a portion of the piezoelectric layer; and
   an electrode connecting member disposed in the substrate, and connected to either one of the lower electrode and the upper electrode,
   wherein the electrode connecting member comprises an insertion electrode disposed in the first recess, and a via electrode connected to the insertion electrode, and disposed on an inner peripheral surface of the second recess and a surface of the substrate.

2. The bulk acoustic filter device of claim 1, wherein a diameter of the first recess is smaller than a diameter of the second recess.

3. The bulk acoustic filter device of claim 1, wherein the insertion electrode is disposed in the first recess and has a cylindrical shape.

4. The bulk acoustic filter device of claim 3, wherein the via electrode is formed by electrolytic plating.

5. The bulk acoustic filter device of claim 1, further comprising a solder ball disposed on the via electrode and configured to be connected to a main substrate.

6. The bulk acoustic filter device of claim 1, wherein the substrate comprises a seed layer disposed on an inner peripheral surface of the through hole.

7. The bulk acoustic filter device of claim 1, wherein the upper electrode comprises a frame portion.

8. The bulk acoustic filter device of claim 7, wherein the filter further comprises a metal pad disposed on the upper electrode and the lower electrode.

9. The bulk acoustic filter device of claim 8, wherein the filter further comprises a passivation layer formed on a region of the upper electrode on which the metal pad is not disposed.

10. The bulk acoustic filter device of claim 1, wherein the through hole comprises a stepped diameter configuration.

11. A method to manufacture a bulk acoustic filter device, comprising:
   forming a first recess in a substrate;
   forming an insertion electrode in the first recess after forming the first recess;
   forming a seed layer on an inner peripheral portion of the first recess;
   forming a filter on the substrate after forming the seed layer;
   forming a second recess in the substrate after forming the filter; and
   forming a via electrode in the second recess, wherein the via electrode is connected to the insertion electrode.

12. The method of claim 11, wherein the via electrode is formed on an inner peripheral surface of the second recess and a surface of the substrate.

13. The method of claim 12, wherein the via electrode is formed through electrolytic plating.

14. The method of claim 11, wherein the insertion electrode is connected to either one of a lower electrode and an upper electrode of the filter.

15. The method of claim 11, wherein a diameter of the first recess is smaller than a diameter of the second recess.

16. The method of claim 11, further comprising:
disposing a solder ball on the via electrode.

17. The method of claim 11, further comprising:
bonding a cap member to the substrate, after the forming of the filter.

18. The method of claim 11, wherein the first recess and the second recess are disposed adjacent to each other to form a through hole.

19. The method of claim 18, wherein the seed layer is formed on both sides of the through hole.

\* \* \* \* \*